(12) United States Patent
Zhang et al.

(10) Patent No.: US 10,096,699 B2
(45) Date of Patent: Oct. 9, 2018

(54) FIELD-STOP REVERSE CONDUCTING INSULATED GATE BIPOLAR TRANSISTOR AND MANUFACTURING METHOD THEREFOR

(71) Applicant: CSMC TECHNOLOGIES FAB1 CO., LTD., Jiangsu (CN)

(72) Inventors: Shuo Zhang, Jiangsu (CN); Qiang Rui, Jiangsu (CN); Genyi Wang, Jiangsu (CN); Xiaoshe Deng, Jiangsu (CN)

(73) Assignee: CSMC Technologies Fab1 Co., Ltd. (CN)

( * ) Notice: Subject to any disclaimer, the term of this patent is extended or adjusted under 35 U.S.C. 154(b) by 0 days.

(21) Appl. No.: 14/392,251

(22) PCT Filed: Jun. 5, 2014

(86) PCT No.: PCT/CN2014/079250
§ 371 (c)(1),
(2) Date: Dec. 24, 2015

(87) PCT Pub. No.: WO2014/206189
PCT Pub. Date: Dec. 31, 2014

(65) Prior Publication Data
US 2016/0163841 A1  Jun. 9, 2016

(30) Foreign Application Priority Data
Jun. 27, 2013 (CN) .......................... 2013 1 0265445

(51) Int. Cl.
*H01L 29/73* (2006.01)
*H01L 21/02* (2006.01)
(Continued)

(52) U.S. Cl.
CPC .... *H01L 29/7395* (2013.01); *H01L 21/02164* (2013.01); *H01L 21/26513* (2013.01);
(Continued)

(58) Field of Classification Search
CPC ..... H01L 29/06; H01L 29/0696; H01L 29/08; H01L 29/40; H01L 29/66;
(Continued)

(56) References Cited

U.S. PATENT DOCUMENTS 4,951,110 A  8/1990  Miller et al.
5,798,549 A  8/1998  Blanchard
(Continued)

FOREIGN PATENT DOCUMENTS

CN  101026161 A  8/2007
CN  101060133 A  10/2007
(Continued)

OTHER PUBLICATIONS

SIPO, Chinese Office Action, dated Sep. 2, 2016, China, Application No. 201310265445.8 (7 Pages).
(Continued)

*Primary Examiner* — Monica D Harrison
(74) *Attorney, Agent, or Firm* — Mark Malek; Daniel Pierron; Widerman Malek, PL

(57) ABSTRACT

A field-stop reverse conducting insulated gate bipolar transistor and a manufacturing method therefor. The transistor comprises a terminal structure (200) and an active region (100). An underlayment of the field-stop reverse conducting insulated gate bipolar transistor is an N-type underlayment, the back surface of the underlayment is provided with an N-type electric field stop layer (1), one surface of the electric field stop layer departing from the underlayment is provided with a back-surface P-type structure (10), and the surface of the back-surface P-type structure is provided with a back-surface metal layer (12). A plurality of notches (11) which penetrate through the back-surface P-type structure (10) from the back-surface metal layer (12) to the electric field stop layer (1) are formed in the active region (100), and
(Continued)

metals of the back-surface metal layer (12) are filled into the notches (11) to form a metal structure which extends into the electric field stop layer (1).

10 Claims, 7 Drawing Sheets

(51) Int. Cl.
*H01L 29/739* (2006.01)
*H01L 29/66* (2006.01)
*H01L 29/06* (2006.01)
*H01L 29/08* (2006.01)
*H01L 21/265* (2006.01)
*H01L 21/28* (2006.01)
*H01L 21/285* (2006.01)
*H01L 21/311* (2006.01)
*H01L 21/324* (2006.01)
*H01L 29/40* (2006.01)
*H01L 29/417* (2006.01)
*H01L 29/423* (2006.01)
*H01L 29/49* (2006.01)

(52) U.S. Cl.
CPC .... *H01L 21/28035* (2013.01); *H01L 21/2855* (2013.01); *H01L 21/31116* (2013.01); *H01L 21/324* (2013.01); *H01L 29/0619* (2013.01); *H01L 29/0804* (2013.01); *H01L 29/0834* (2013.01); *H01L 29/404* (2013.01); *H01L 29/405* (2013.01); *H01L 29/407* (2013.01); *H01L 29/41708* (2013.01); *H01L 29/42364* (2013.01); *H01L 29/4916* (2013.01); *H01L 29/66333* (2013.01); *H01L 29/402* (2013.01)

(58) Field of Classification Search
CPC ............... H01L 29/66333; H01L 29/73; H01L 29/7395; H01L 29/7397; H01L 29/10; H01L 29/402; H01L 29/1095; H01L 21/02; H01L 21/28; H01L 21/31; H01L 21/40; H01L 29/061; H01L 29/0619; H01L 29/083; H01L 29/0834; H01L 29/08; H01L 29/0804; H01L 29/404; H01L 29/405; H01L 29/407; H01L 29/41; H01L 29/417; H01L 29/417; H01L 29/41708; H01L 29/42; H01L 29/423; H01L 29/4236; H01L 29/42364; H01L 29/49; H01L 29/491; H01L 29/4916; H01L 29/663; H01L 29/6633; H01L 21/021; H01L 21/0216; H01L 21/02164; H01L 21/26; H01L 21/265; H01L 21/2651; H01L 21/26513; H01L 21/28; H01L 21/285; H01L 21/2855; H01L 21/28035; H01L 21/311; H01L 21/3111; H01L 21/31116; H01L 21/32; H01L 21/324
USPC ........................................................ 257/139
See application file for complete search history.

(56) References Cited

U.S. PATENT DOCUMENTS

| | | | |
|---|---|---|---|
| 6,054,748 A | 4/2000 | Tsukuda et al. | |
| 6,429,481 B1 | 8/2002 | Sze-Ki et al. | |
| 7,659,576 B2 | 2/2010 | Okada et al. | |
| 8,299,495 B2 * | 10/2012 | Inagawa | H01L 29/0695 257/139 |
| 9,224,802 B2 * | 12/2015 | Hiyoshi | H01L 29/66068 |
| 2007/0096167 A1 | 5/2007 | Francis et al. | |
| 2008/0013570 A1 | 6/2008 | Kikuo et al. | |
| 2010/0025820 A1 | 2/2010 | Suekawa | |
| 2013/0005093 A1 | 1/2013 | Ogino | |

FOREIGN PATENT DOCUMENTS

| | | |
|---|---|---|
| CN | 103137472 A | 6/2013 |
| JP | H02-163973 | 6/1990 |
| JP | 2007019518 A | 1/2007 |
| JP | 2011035322 A | 2/2011 |
| JP | 2013110373 A | 6/2013 |
| WO | WO 2012/046329 A1 | 4/2012 |

OTHER PUBLICATIONS

Chinese State Intellectual Property Office, "International Search Report for PCT/CN2014/079250", dated Dec. 31, 2014, China (5 Pages).
Chinese State Intellectual Property Office, "International Search Report for PCT/CN2014/079250", dated Dec. 31, 2014, English (3 Pages).
Chinese State Intellectual Property Office, "Written Opinion for PCT/CN2014/079250", dated Dec. 27, 2015, China (3 Pages).
Chinese State Intellectual Property Office, "Written Opinion for PCT/CN2014/079250", Sep. 1, 2014, English (7 Pages).
European Patent Office, "EP Patent Search Report for PCT/CN2014079250", Dec. 6, 2016, EPO, English (11 Pages).

* cited by examiner

FIELD-STOP REVERSE CONDUCTING INSULATED GATE BIPOLAR TRANSISTOR AND MANUFACTURING METHOD THEREFOR

FIELD OF THE INVENTION

The present invention relates to a manufacturing method of a semiconductor device, and particularly relates to a field stop reverse conducting insulated gate bipolar transistor, and further relates to a manufacturing method of the field stop reverse conducting insulated gate bipolar transistor.

BACKGROUND OF THE INVENTION

The insulated gate bipolar transistor (IGBT) is generally used in a manner of a reverse parallel freewheeling diode. However, on one hand, this manner results in waste of the package area; on the other hand, due to the existence of parasitic effects such as a parasitic inductor, the parallel additionally increases the power consumption. Therefore, the technology of integrating the IGBT and the diode in a same chip is increasingly emphasized.

The back side N+ type and the P+ type of the conventional reverse conducting insulated gate bipolar transistor (RC-IGBT) spread the whole back side of the IGBT. When turning on the diode, a large number of holes is injected via the positive pole (the emitter of the IGBT), a part of which come into the cathode through the N-drifting region of the terminal. When recovering reversing of the diode, the holes stored below the terminal cannot be empty and disappear quickly. The recovering characteristic of the diode has to be improved by the controlling technology for the carrier lifetime such as irradiation.

SUMMARY OF THE INVENTION

On the basis of this, it is necessary to provide a field stop reverse conducting insulated gate bipolar transistor having a better reverse recovering characteristic.

A field stop reverse conducting insulated gate bipolar transistor includes: a peripheral terminal structure and an active region surrounded by the terminal structure, a substrate of the field stop reverse conducting insulated gate bipolar transistor being an N-type substrate, a back side of the substrate being disposed with an N-type field stop layer, a side of the field stop layer away from the substrate being disposed with a back side P-type structure, a surface of the back side P-type structure away from the substrate being disposed with a back side metal layer; a plurality of notches are formed in the active region extending from the back side metal layer through the back side P-type structure into the field stop layer, a metal of the back side metal layer is filled in the plurality of notches to form a metal structure extending into the field stop layer, the plurality of notches and the metal structure extending into the field stop layer are not disposed in the terminal structure.

In one of embodiments, a field limiting ring is disposed in the terminal structure at a front side of the substrate, a silicon oxide layer is disposed on the field limiting ring; a P well is disposed in the active region at the front side of the substrate, an N-type emitter is disposed in the P well, a gate oxide layer is disposed at the front side of the substrate, a polysilicon gate is disposed at a surface of the gate oxide layer, the polysilicon gate is covered by the silicon oxide layer, an emitter metal structure is disposed on the P well, the silicon oxide layer and the emitter metal structure are covered by a passivation layer.

In one of embodiments, both the field stop layer and the emitter are the N+ type, the back side P-type structure are the P+ type.

In one of embodiments, the back side metal layer and the metal structure extending into the field stop layer are the aluminum-titanium-nickel-silver structures.

In one of embodiments, the field stop reverse conducting insulated gate bipolar transistor is a plane gate insulated gate bipolar transistor.

It is also necessary to provide a manufacturing method of a field stop reverse conducting insulated gate bipolar transistor.

A manufacturing method of a field stop reverse conducting insulated gate bipolar transistor includes the following steps: step A, providing an N-type substrate, regarding a side of the substrate as a back side, forming an N-type field stop layer at the back side; step B, performing a first phrase front side process; which comprising forming a high voltage-resisting structure at a terminal structure peripheral to a front side of the substrate of the field stop reverse conducting insulated gate bipolar transistor, forming a gate oxide layer at a front surface of a substrate of a active region area surrounded by the terminal structure, and forming a polysilicon gate at a surface of the gate oxide layer, forming a P well in the active region area at the front side of the substrate, forming an N-type emitter in the P well, forming a silicon oxide layer covering the front side of the substrate and the polysilicon gate; step C, forming a back side P-type structure at a side of the field stop layer away from the substrate; step D, performing a second phrase front process, which comprising photoetching and etching the silicon oxide layer, forming a contact hole having a part of the P well and the emitter exposing, filling an emitter metal structure in the contact hole, forming a passivation layer covering the silicon oxide layer and the emitter metal structure; step E, forming a plurality of notches in the active region area through the back side P-type structure into the field stop layer, and forming a back side metal layer, wherein the back side metal layer is filled in the notches to form a metal structure extending in the field stop layer.

In one of embodiments, the step B comprises: implanting P-type dopant at the front side of the substrate by photoetching, after thermal diffusion forming a field limiting ring as the high voltage-resisting structure; growing a field oxide layer at the front side of the substrate, and photoetching and etching the field oxide layer on the active region area; growing a gate oxide layer at the front side of the substrate, and forming a polysilicon layer at a surface of the gate oxide layer; removing a surplus part of the polysilicon layer and the gate oxide layer by photoetching and etching, for forming a polysilicon gate, and ion-implanting P-type dopant to the substrate by a self-aligning ion implantation process, forming the P well after driving-in; photoetching and implanting N-type dopant ions to the P well to form the emitter; depositing an oxide dielectric layer, the silicon oxide layer covering the front side of the substrate and the polysilicon gate is formed by the field oxide layer and the deposited oxide dielectric layer.

In one of embodiments, in the step B the step of growing the gate oxide layer at the front side of the substrate is to grow a gate oxide layer with a thickness of 600 angstrom to 1500 angstrom.

In one of embodiments, the step E comprises forming a plurality of notches in the active region area extending through the back side P-type structure into the field stop layer by photoetching and etching, and forming the back side metal layer and the metal structure extending in the field stop layer by a sputtering process; both the field stop layer and the emitter are the N+ type, the back side P-type structure is the P+ type.

In one of embodiments, prior to the step C, the method further comprises a step of forming a front side protecting layer on the silicon oxide layer; after the step C but prior to the step D, the method further comprises a step of removing the front side protecting layer.

The field stop reverse conducting insulated gate bipolar transistor described above does not form a metal structure extending in the field stop layer in the terminal structure. Therefore, when turning on the diode, only a few part of holes flow through the drifting region of the terminal structure, reducing the recovering current when the built-in diode is recovered and then improving the reverse recovering capacity of the built-in diode.

DETAILED DESCRIPTION OF THE EMBODIMENTS

The details of one or more embodiments of the invention are set forth in the accompanying drawings and the description below. Other features, objects, and advantages of the invention will be apparent from the description and drawings, and from the claims.

Figure 1:
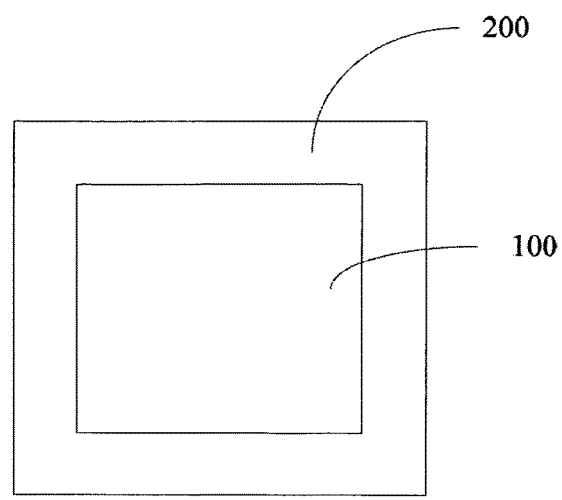
FIG. 1 is a top view of a terminal structure and an active region of a field stop reverse conducting insulated gate bipolar transistor in an embodiment.
Figure 2:
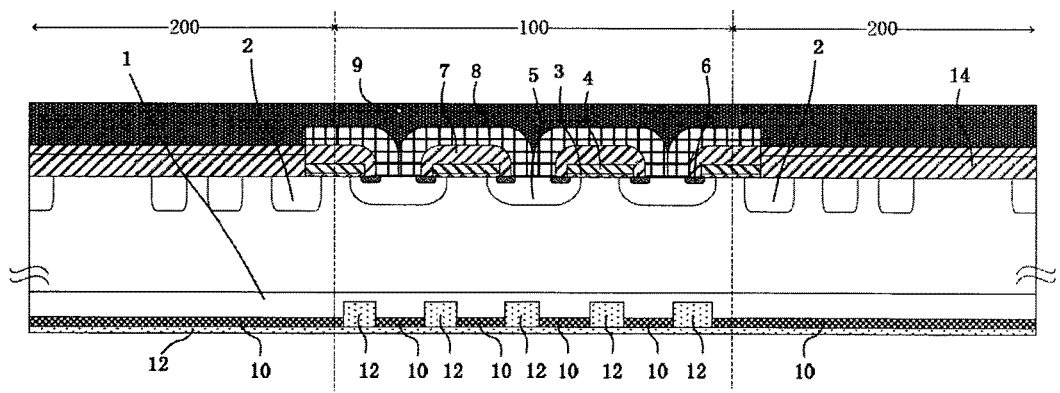
FIG. 2 is a cross-section view of the field stop reverse conducting insulated gate bipolar transistor in an embodiment.

FIG. 1 is a top view of the terminal structure and the active region of the field stop reverse conducting insulated gate bipolar transistor in an embodiment, FIG. 2 is a cross-section view of the field stop reverse conducting insulated gate bipolar transistor in an embodiment. The field stop reverse conducting insulated gate bipolar transistor includes a peripheral terminal structure 200 and an active region 100 surrounded by the terminal structure 200. In the illustrated embodiment shown in FIG. 2, a substrate of the field stop reverse conducting insulated gate bipolar transistor is an N-type substrate. A back side of the substrate is provided with an N-type field stop layer 1 (i.e. the field stop layer), and a dopant concentration of the field stop layer 1 is higher than that of the substrate. A side of the field stop layer 1 away from the substrate is disposed with a back side P-type structure 10. A surface of the back side P-type structure 10 away from the substrate is disposed with a back side metal layer 12. In the embodiment, the back side metal layer 12 employs the Al—Ti—Ni—Ag structure. A plurality of metal structure are formed in the active region 100 extending from the back side metal layer 12 through the back side P-type structure 10 into the field stop layer 1, after firstly forming a plurality of notches through the back side P-type structure 10 into the field stop layer 1, the metal structure is formed by filling the back side metal layer 12 in the plurality of notches. The plurality of notches and the metal structure extending into the field stop layer 1 are not disposed in the terminal structure 200.

The field stop reverse conducting insulated gate bipolar transistor described above does not form the metal structure extending into the field stop layer 1 in the terminal structure 200. Therefore, when turning on the diode, only a few part of holes flow through the drifting region in the terminal structure 200, reducing the recovering current when the built-in diode is recovered and then improving the reverse recovering capacity of the built-in diode.

The embodiment shown in the FIG. 2 uses a plane gate insulated gate bipolar transistor as an example to illustrate the structure of IGBT. It can be understood that, hereinabove, the back side structure of the metal structure extending into the field stop layer 1 is formed only in the active region 100, which can be also applied to the trench gate IGBT.

Referring to FIG. 2, a P-type field limiting ring 2 is disposed in the terminal structure 200 at a front side of the substrate. A plurality of the field limiting rings 2 can be disposed, the number of which is omitted in FIG. 2. A field oxide layer 14 and an oxide dielectric layer 7 are disposed on the field limiting ring 2, and a silicon oxide layer is formed by the field oxide layer 14 and the oxide dielectric layer 7.

A P well 5 is disposed in the active region 100 at the front side of the substrate; an N-type emitter 6 is disposed in the P well 5. A gate oxide layer 3 is disposed at the front side of the substrate, a polysilicon gate 4 is disposed at a surface of the gate oxide layer 3, and the polysilicon gate 4 is also covered by the silicon oxide layer (the oxide dielectric layer 7). The polysilicon gate 4 is disposed between two adjacent P wells 5, and between a P well 5 at boundary of the active region 100 and the terminal structure 200 and a field limiting ring 2. An emitter metal structure 8 is disposed on the P well 5, the silicon oxide layer and the emitter metal structure 8 is covered by a passivation layer 9. The function of the passivation layer 9 is used for preventing the surface of the chip from contaminating of the external ions. In the embodiment, the material of the passivation layer 9 is SiN.

In the embodiment as shown in FIG. 2, both the field stop layer 1 and the emitter 6 are the N+ type, the back side P-type structure 10 is the P+ type.

Figure 3:
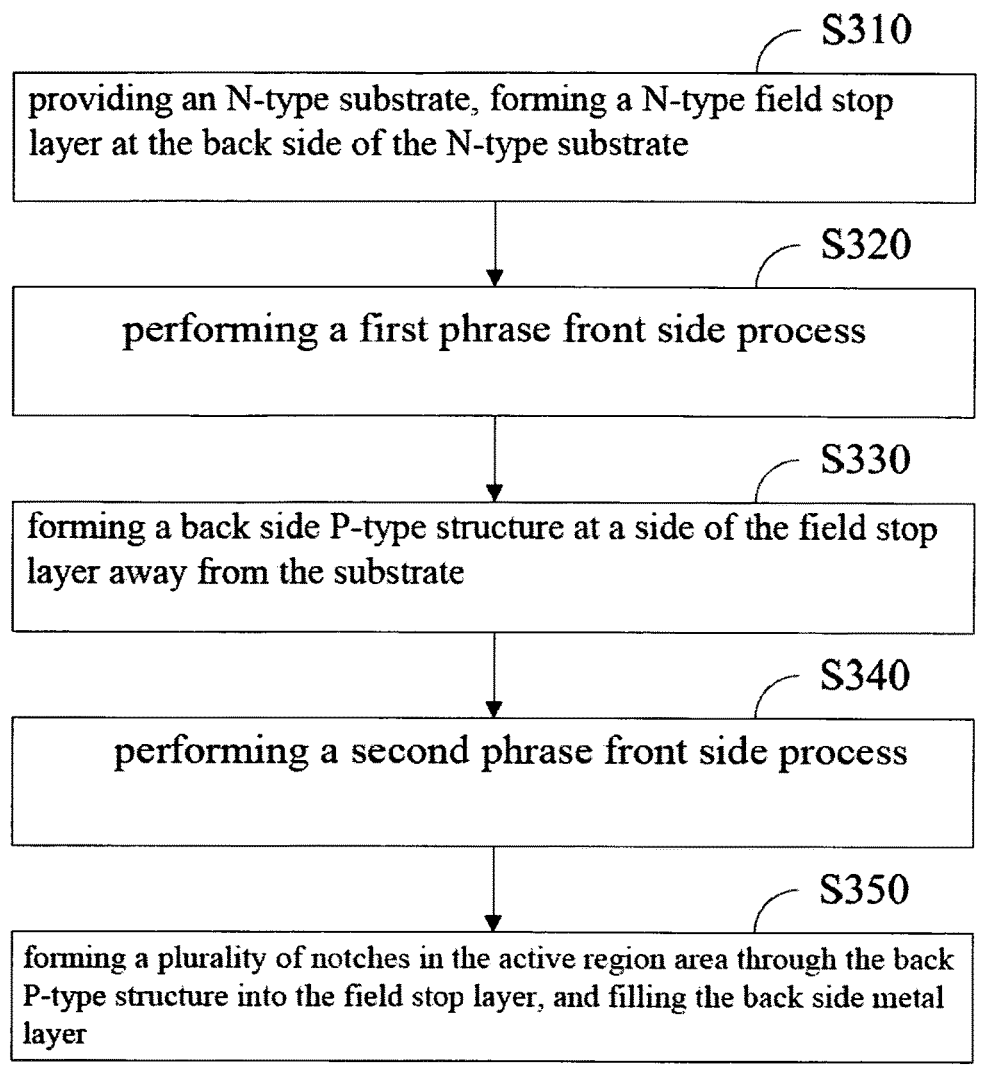
FIG. 3 shows a flow chart of a manufacturing method of the field stop reverse conducting insulated gate bipolar transistor in an embodiment.

As shown in FIG. 3, a manufacturing method of a field stop reverse conducting insulated gate bipolar transistor comprises the following steps:

S310, providing an N-type substrate, forming an N-type field stop layer at the back side of the N-type substrate.

Figure 4A:
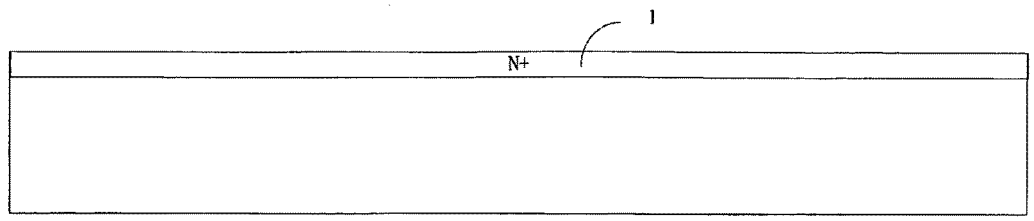
FIGS. 4A to 4K are cross-section views during manufacturing the field stop reverse conducting insulated gate bipolar transistor in an embodiment.

Referring to FIG. 4A, in the embodiment, a dopant concentration of the N+ field stop layer 1 is higher than that of the substrate.

S320, performing a first phrase front side process.

Figure 4B:
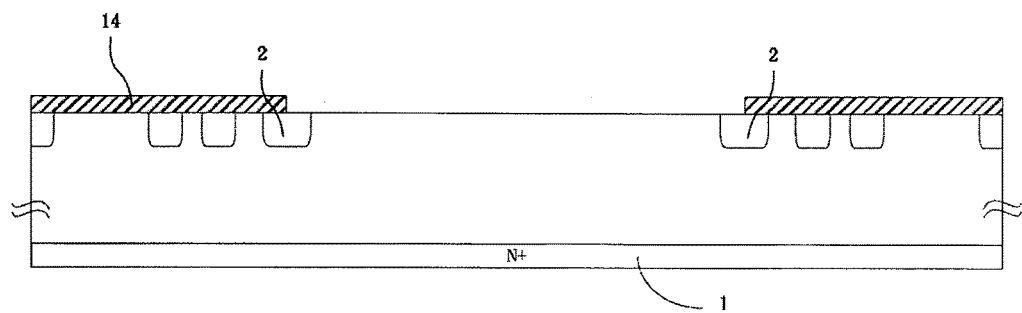
Figure 4C:
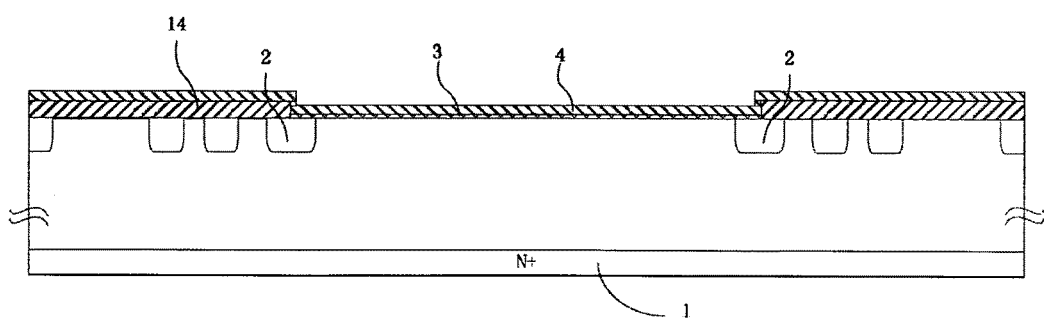
Figure 4D:
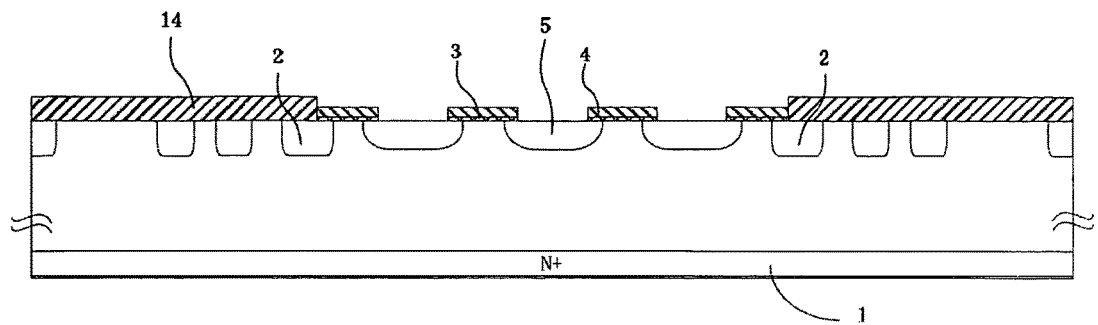
Figure 4E:
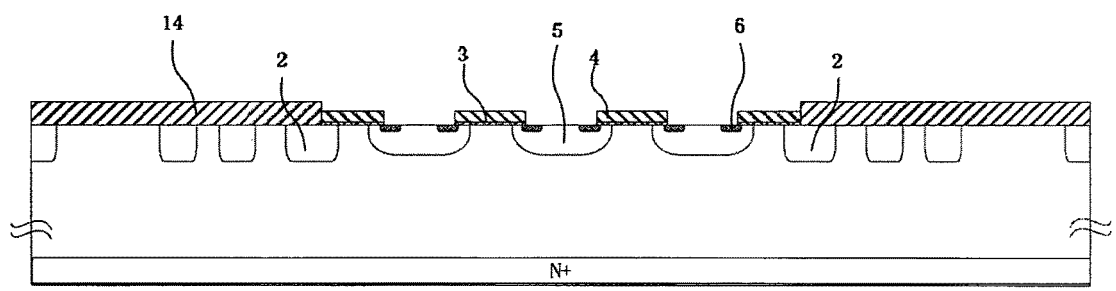
Figure 4F:
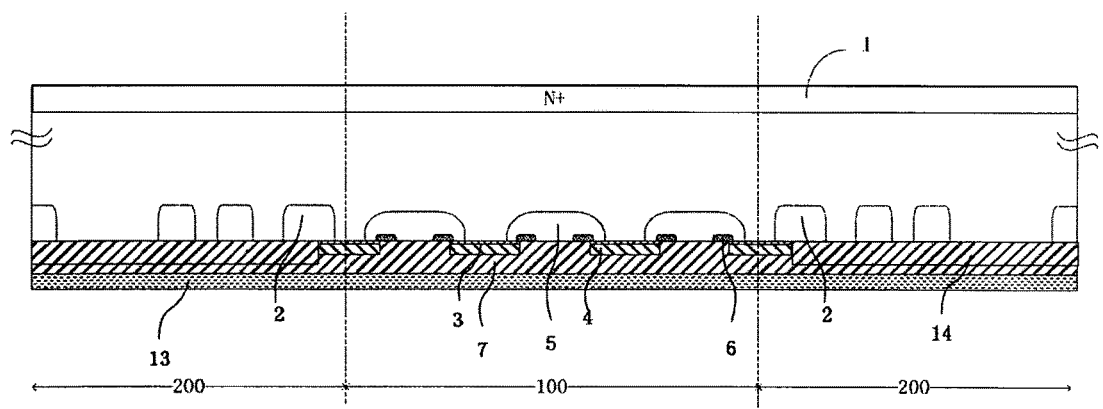

FIG. 4F shows a cross-section view of the field stop reverse conducting insulated gate bipolar transistor after the step S320 is performed. The step S320 specifically comprises forming a high voltage-resisting structure at the terminal structure 200 area peripheral to the front side of the substrate of the field stop reverse conducting insulated gate bipolar transistor, forming a gate oxide layer 3 at a front surface of a substrate of a active region 100 area surrounded by the terminal structure 200, and forming a polysilicon gate 4 at a surface of the gate oxide layer 3, forming a P well 5 in the active region 100 area at the front side of the substrate, forming an N-type emitter 6 in the P well 5, forming a silicon oxide layer covering the front side of the substrate and the polysilicon gate. The silicon oxide layer is formed by the field oxide layer 14 and the oxide dielectric layer 7.

In the embodiment shown in the FIG. 4F, in order to prevent the wafer from damaging the front side structure thereof when performing the back side process, after forming the silicon oxide layer, it further comprises the step of forming a front side protecting layer 13 on the silicon oxide layer.

S330, forming a back side P-type structure at a side of the field stop layer away from the substrate.

Figure 4G:
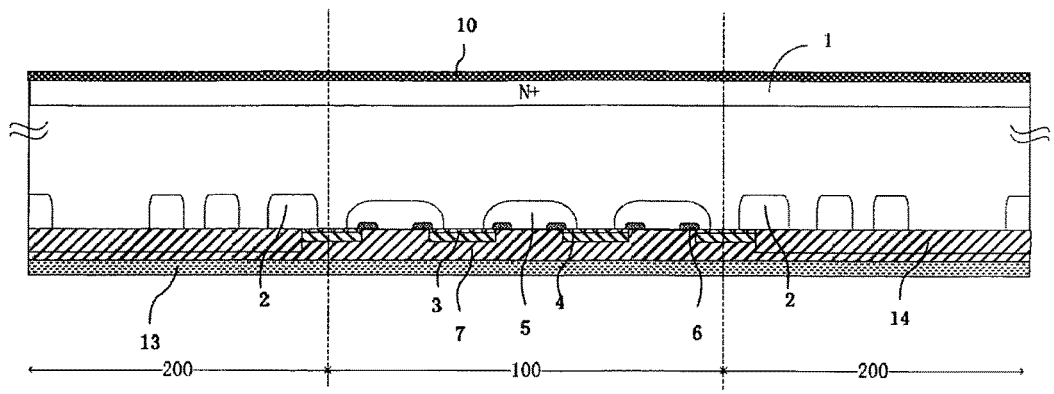

FIG. 4G shows a cross-section view of the field stop reverse conducting insulated gate bipolar transistor after the step S330 is performed.

Figure 4H:
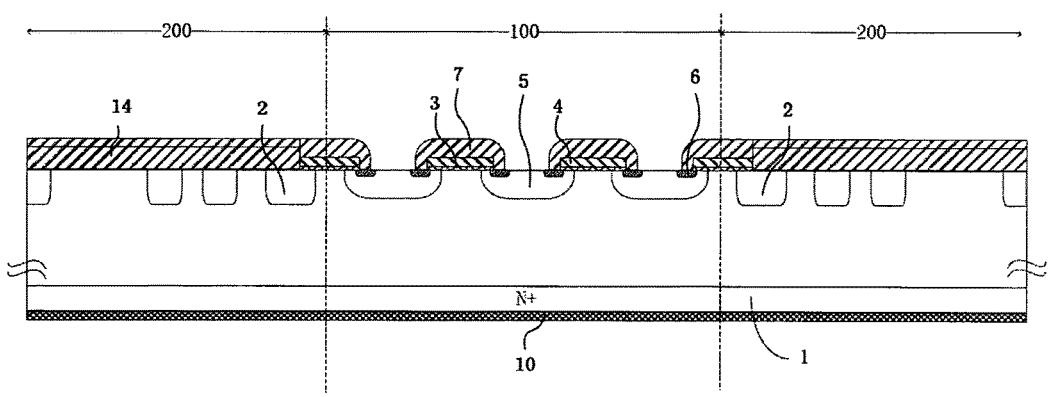

Referring to FIG. 4H, after the step S330 is performed it needs to remove the front side protecting layer 13.

S340, performing a second phrase front side process.

Figure 4I:
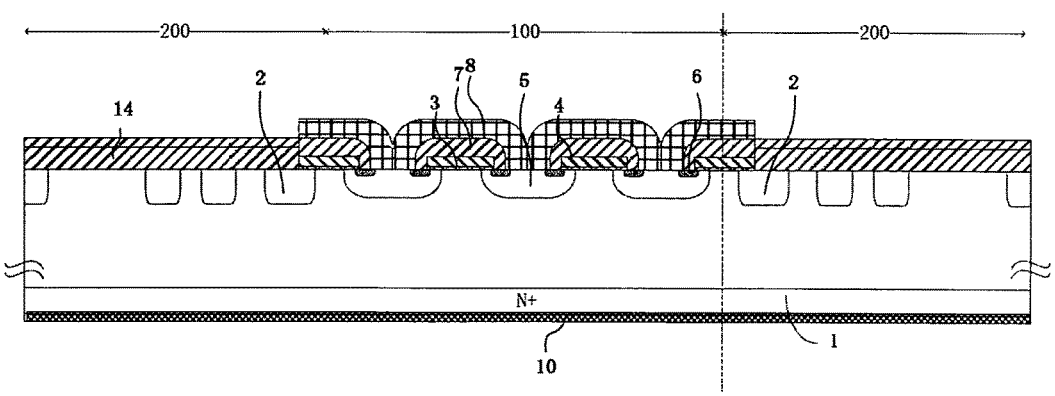
Figure 4J:
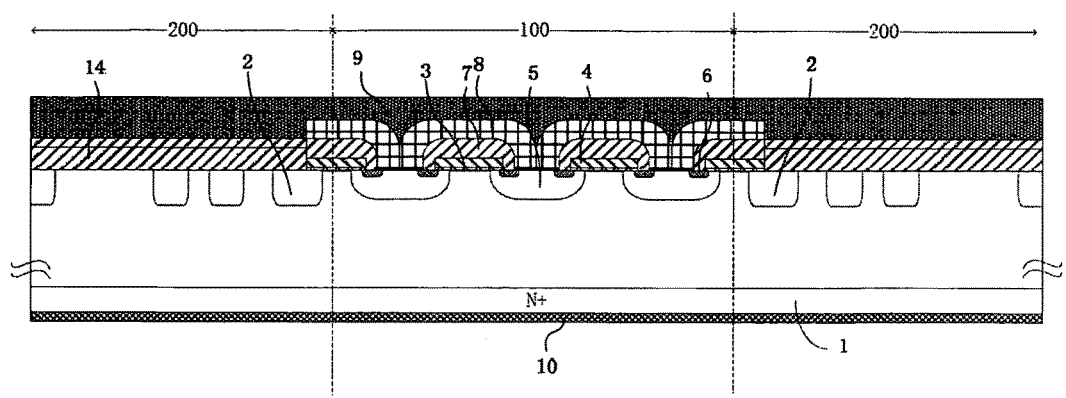

FIG. 4J shows a cross-section view of the field stop reverse conducting insulated gate bipolar transistor after the step S340 is performed. The second phrase front side process specifically comprises photoetching and etching the oxide dielectric layer 7, forming a contact hole by having a part of the P well 5 and the emitter 6 exposing, filling an emitter metal structure 8 in the contact hole, then forming a passivation layer 9. The silicon oxide layer and the emitter metal structure 8 is covered by the passivation layer 9. The function of the passivation layer 9 is to prevent the surface of the chip from contaminating of the external ions. In the embodiment, the material of the passivation layer 9 is SiN.

S350, forming a plurality of notches in the active region through the back side P-type structure into the field stop layer, wherein the back side metal layer is filled in the plurality of notches.

Figure 4K:
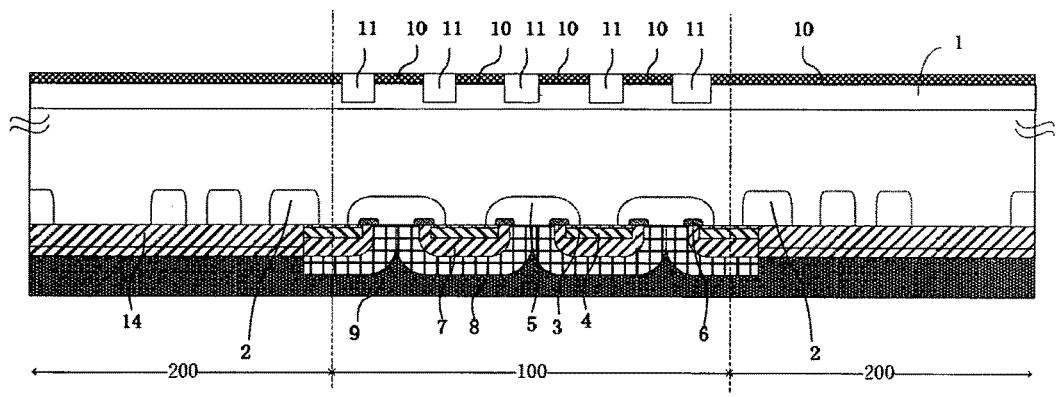

Referring to FIG. 4K, forming a plurality of notches 11, wherein the back side metal layer is filled in the plurality of notches to form a metal structure extending in the field stop layer, as shown in FIG. 2. In the embodiment, the back side metal layer 12 employs an Al—Ti—Ni—Ag structure.

The devices manufactured by the manufacturing method of the field stop reverse conducting insulated gate bipolar transistor described above does not form a metal structure extending in the field stop layer 1 in the terminal structure 200. Therefore, when turning on the diode, only a few part of holes flow through the drifting region of the terminal structure 200, reducing the recovering current when the built-in the diode is recovered and then improving the reverse recovering capacity of the built-in diode.

On the other hand, the manufacturing process of RC-IGBT in the conventional technology generally performs the back side photoetching in a twice after the front side process is performed. In other words, firstly performing photoetch, implantation and diffusion to form the P+ type area, then again performing photoetch, implantation and diffusion to form the N+ type area. Because forming of the metal layer has been done in the front side process, the following annealing process can only employ a lower temperature, and it is difficult to obtain a better annealing effect.

However, the manufacturing method of a field stop reverse conducting insulated gate bipolar transistor described above employs two steps to perform the front side process, making for the back side P-type structure 10 is in advance of making for the metal layer (i.e. the emitter metal structure) of the front side process, thus prior to forming the emitter metal structure 8, a higher temperature can be applied to an annealing process, obtaining a higher activity ratio of implanting ions at the back side.

Figure 5:
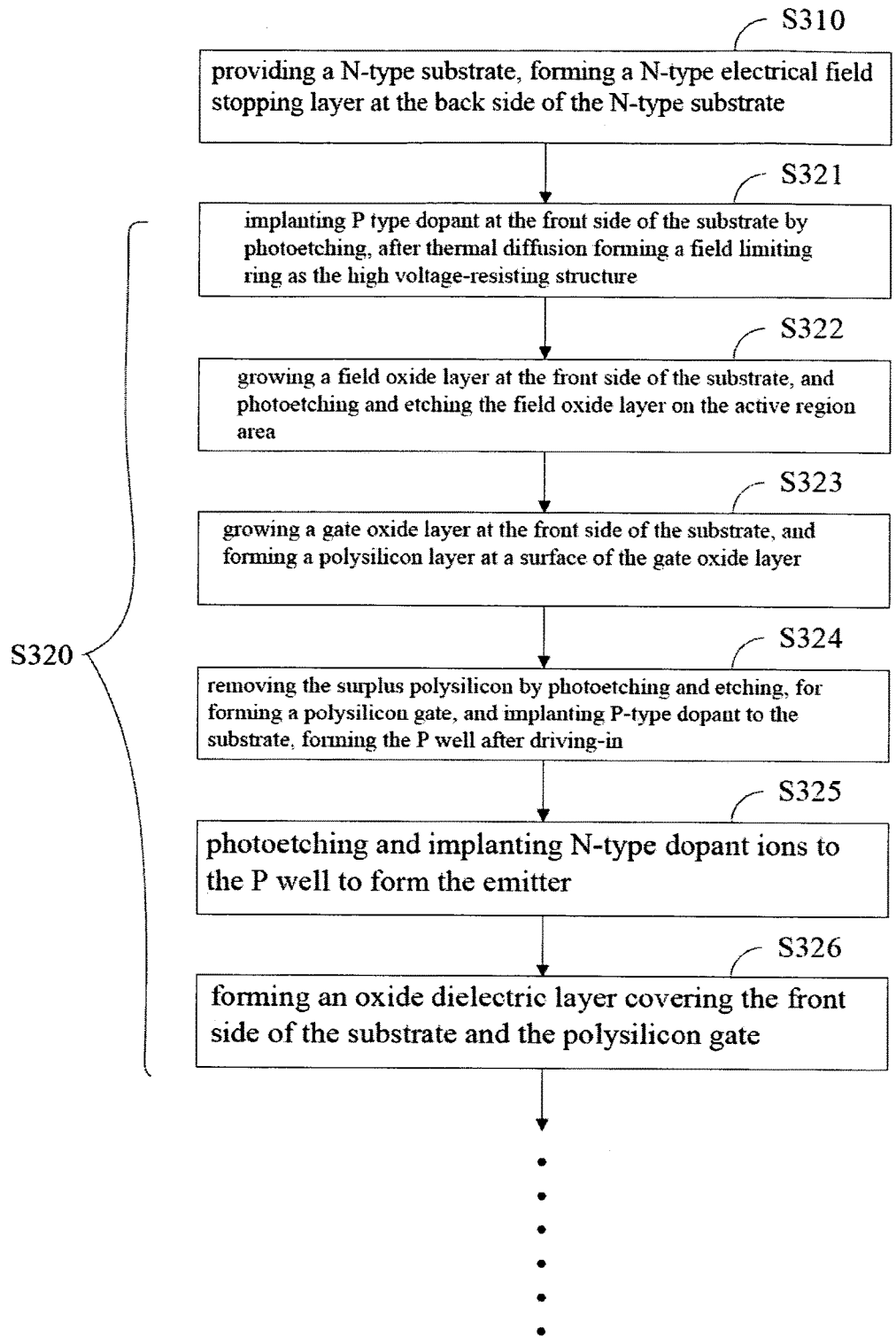
FIG. 5 shows a specific flow chart of the step S320 in an embodiment.

Referring to FIG. 5, in one of embodiments, S320 specifically comprises the following steps:

S321, implanting P-type dopant at the front side of the substrate by photoetching, after thermal diffusion forming a field limiting ring 2 as the high voltage-resisting structure.

In the embodiment the field limiting ring is used as the high voltage-resisting structure. In other embodiments the field plate can be also used as the high voltage-resisting structure. Or it can be the high voltage-resisting structure of the field limiting ring plus the field plate, or the high voltage-resisting structure for other terminals.

S322, growing a field oxide layer 14 at the front side of the substrate, and photoetching and etching the field oxide layer 14 on the active region area.

FIG. 4B shows a cross-section view of the field stop reverse conducting insulated gate bipolar transistor after the step S322 is performed.

S323, growing a gate oxide layer at the front side of the substrate, and forming a polysilicon layer at a surface of the gate oxide layer.

FIG. 4C shows a cross-section view of the field stop reverse conducting insulated gate bipolar transistor after the step S323 is performed. In the embodiment, growing the gate oxide layer 3 with a thickness of 600 angstrom to 1500 angstrom by the thermal oxidation, then depositing and forming the polysilicon layer 4 at the surface of the gate oxide layer 3.

S324, removing a surplus part of the polysilicon layer and the gate oxide layer by photoetching and etching, for forming a polysilicon gate, and ion-implanting P-type dopant to the substrate, forming the P well after driving-in.

FIG. 4D shows a cross-section view of the field stop reverse conducting insulated gate bipolar transistor after the step S324 is performed. In the embodiment, the ions are injected by a self-aligning implantation process for forming the P well 5.

S325, photoetching and implanting N-type dopant ions to the P well to form the emitter.

FIG. 4E shows a cross-section view of the field stop reverse conducting insulated gate bipolar transistor after the step S325 is performed. After an N+ implantation window is formed by photoetching, the N+ emitter 6 is formed by implanting and driving-in of ions.

S326, forming the oxide dielectric layer covering the front side of the substrate and the polysilicon gate.

In the embodiment, forming the oxide dielectric layer 7 by depositing, and then forming the previous front side protecting layer 13 by using a furnace tube. Therefore, a protecting layer is also formed at the back side of the wafer, it needs to remove that at the back side prior to the step S330 is performed.

The step S330 is performed after the step S326 is performed. Referring to FIG. 4F and FIG. 4G, the P-type ions can be implanted after photoetching, for forming the P+ back side P-type structure 10.

Referring to FIG. 4I, in the embodiment, the emitter metal structure 8 is formed by a sputtering process, and it needs to remove a surplus part of metal by the photoetching and etching process.

Referring to FIG. 4J, in the embodiment, the passivation layer is formed by the chemical vapour deposition process, and it requires a pad area (not shown in FIG. 4J) for leading the gate electrode and the emitter electrode out, which is formed by photoetching and etching.

The plurality of notches 11 in FIG. 4K can be formed by photoetching and then etching. The characteristics of IGBT and the built-in diode thereof can be adjusted by adjusting the width and depth of the plurality of notches 11.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A field stop reverse conducting insulated gate bipolar transistor, comprising: a peripheral terminal structure and an active region surrounded by the terminal structure, a substrate of the field stop reverse conducting insulated gate bipolar transistor being an N-type substrate, a back side of the substrate being disposed with an N-type field stop layer, a side of the field stop layer away from the substrate being disposed with a back side P-type structure, a surface of the back side P-type structure away from the substrate being disposed with a back side metal layer;

characterized in that, a plurality of notches are formed in the active region extending from the back side metal layer through the back side P-type structure into the field stop layer, a metal of the back side metal layer is filled in the plurality of notches to form a metal structure extending into the field stop layer, the plurality of notches and the metal structure extending into the field stop layer are not disposed in the terminal structure.

2. The field stop reverse conducting insulated gate bipolar transistor of claim 1, characterized in that, a field limiting ring is disposed in the terminal structure at a front side of the substrate, a silicon oxide layer is disposed on the field limiting ring;

a P well is disposed in the active region at the front side of the substrate, an N-type emitter is disposed in the P well, a gate oxide layer is disposed at the front side of the substrate, a polysilicon gate is disposed at a surface of the gate oxide layer, the polysilicon gate is covered by the silicon oxide layer, an emitter metal structure is disposed on the P well, the silicon oxide layer and the emitter metal structure are covered by a passivation layer.

3. The field stop reverse conducting insulated gate bipolar transistor of claim 2, characterized in that, both the field stop layer and the emitter are the N+ type, the back side P-type structure is the P+ type.

4. The field stop reverse conducting insulated gate bipolar transistor of claim 1, characterized in that, the back side metal layer and the metal structure extending into the field stop layer are aluminum-titanium-nickel-silver structures.

5. The field stop reverse conducting insulated gate bipolar transistor of claim 1, characterized in that, the field stop reverse conducting insulated gate bipolar transistor is a plane gate insulated gate bipolar transistor.

6. A manufacturing method of a field stop reverse conducting insulated gate bipolar transistor, comprising the following steps:

step A, providing an N-type substrate, regarding a side of the substrate as a back side, forming an N-type field stop layer at the back side;

step B, performing a first phrase front side process; which comprising forming a high voltage-resisting structure at a terminal structure peripheral to a front side of the substrate of the field stop reverse conducting insulated gate bipolar transistor, forming a gate oxide layer at a front surface of a substrate of a active region area surrounded by the terminal structure, and forming a polysilicon gate at a surface of the gate oxide layer, forming a P well in the active region area at the front side of the substrate, forming an N-type emitter in the P well, forming a silicon oxide layer covering the front side of the substrate and the polysilicon gate;

step C, forming a back side P-type structure at a side of the field stop layer away from the substrate;

step D, performing a second phrase front side process; which comprising photoetching and etching the silicon oxide layer, forming a contact hole having a part of the P well and the emitter exposing, filling an emitter metal structure in the contact hole, forming a passivation layer covering the silicon oxide layer and the emitter metal structure; and step E, forming a plurality of notches in the active region area through the back side P-type structure into the field stop layer, and forming a back side metal layer, wherein the back side metal layer is filled in the plurality of notches to form a metal structure extending in the field stop layer.

7. The manufacturing method of the field stop reverse conducting insulated gate bipolar transistor of claim 6, characterized in that, the step B comprises:

implanting P-type dopant at the front side of the substrate by photoetching, after thermal diffusion, forming a field limiting ring as the high voltage-resisting structure;

growing a field oxide layer at the front side of the substrate, and photoetching and etching the field oxide layer on the active region area;

growing a gate oxide layer at the front side of the substrate, and forming a polysilicon layer at a surface of the gate oxide layer;

removing a surplus part of the polysilicon layer and the gate oxide layer by photoetching and etching, and forming a polysilicon gate, and ion-implanting P-type dopant to the substrate by a self-aligning implantation process, forming the P well after driving-in;

photoetching and implanting N-type dopant ions to the P well to form the emitter;

depositing an oxide dielectric layer, the field oxide layer and the deposited oxide dielectric layer forming the silicon oxide layer covering the front side of the substrate and the polysilicon gate.

8. The manufacturing method of the field stop reverse conducting insulated gate bipolar transistor of claim 7, characterized in that, in the step B, the step of growing the gate oxide layer at the front side of the substrate is to grow a gate oxide layer with a thickness of 600 angstrom to 1500 angstrom.

9. The manufacturing method of the field stop reverse conducting insulated gate bipolar transistor of claim 7, characterized in that, the step E comprises forming a plurality of notches in the active region area through the back side P-type structure into the field stop layer by photoetching and etching, and forming the back side metal layer and the metal structure extending in the field stop layer by a sputtering process;

both the field stop layer and the emitter are the N+ type, the back side P-type structure is the P+ type.

10. The manufacturing method of a field stop reverse conducting insulated gate bipolar transistor of claim 6, characterized in that, prior to the step C, the method further comprises a step of forming a front side protecting layer on the silicon oxide layer; after the step C and prior to the step D, the method further comprises a step of removing the front side protecting layer.

* * * * *